(12) United States Patent
Obata

(10) Patent No.: US 12,296,407 B2
(45) Date of Patent: May 13, 2025

(54) LASER PROCESSING APPARATUS

(71) Applicant: DISCO CORPORATION, Tokyo (JP)

(72) Inventor: Tsubasa Obata, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 244 days.

(21) Appl. No.: 17/929,109

(22) Filed: Sep. 1, 2022

(65) Prior Publication Data

US 2023/0073693 A1 Mar. 9, 2023

(30) Foreign Application Priority Data

Sep. 3, 2021 (JP) ................................ 2021-143834

(51) Int. Cl.
*B23K 26/364* (2014.01)
*B23K 26/073* (2006.01)
*B23K 26/70* (2014.01)
*B29C 64/165* (2017.01)
*H01L 21/67* (2006.01)
*B23K 103/00* (2006.01)

(52) U.S. Cl.
CPC .......... *B23K 26/364* (2015.10); *B23K 26/073* (2013.01); *B23K 26/705* (2015.10); *B29C 64/165* (2017.08); *H01L 21/67282* (2013.01); *B23K 2103/56* (2018.08)

(58) Field of Classification Search
CPC .. B23K 26/364; B23K 26/705; B23K 26/073; B23K 2103/56; H01L 21/67282
See application file for complete search history.

(56) References Cited

U.S. PATENT DOCUMENTS

| | | | |
|---|---|---|---|
| 2005/0115940 A1* | 6/2005 | Matsushita | B23K 26/705 219/121.62 |
| 2005/0170572 A1* | 8/2005 | Hongo | B23K 26/0853 250/341.1 |
| 2017/0063025 A1* | 3/2017 | Wakabayashi | H01S 3/1394 |
| 2024/0123543 A1* | 4/2024 | Ito | B23K 26/073 |

FOREIGN PATENT DOCUMENTS

| | | |
|---|---|---|
| JP | 2010158710 A | 7/2010 |
| JP | 2020182960 A | 11/2020 |
| JP | 2021-087975 A | 6/2021 |

OTHER PUBLICATIONS

Office Action issued by the Japanese Patent Office in corresponding JP Patent Application No. 2021-143834, dated Jan. 7, 2025.

* cited by examiner

*Primary Examiner* — Nahida Sultana
(74) *Attorney, Agent, or Firm* — GREER BURNS & CRAIN, LTD.

(57) ABSTRACT

A laser processing apparatus includes a laser oscillator configured to emit a laser beam, a slit configured to narrow a width of the laser beam emitted from the laser oscillator to a width corresponding to a dividing groove to form the dividing groove of a predetermined width, a slit moving mechanism configured to move the slit in a direction corresponding to a width direction of the dividing groove, and an adjusting unit configured to make the center of the slit and the cross-sectional center of the laser beam entering the slit coincide with each other in a direction in which the slit moving mechanism moves the slit.

3 Claims, 6 Drawing Sheets

LASER PROCESSING APPARATUS

BACKGROUND OF THE INVENTION

Field of the Invention

The present invention relates to a laser processing apparatus.

Description of the Related Art

As disclosed in Japanese Patent Laid-Open No. 2010-158710 and Japanese Patent Laid-Open No. 2020-182960, a laser processing apparatus performs ablation processing that forms dividing grooves extending in an X-axis direction in the surface of a wafer by irradiating the wafer with a laser beam. Then, chips formed as small pieces are manufactured by division processing that divides the wafer along the formed dividing grooves.

The width of each of the dividing grooves is narrowed to produce a large number of chips. Therefore, a slit is used which has a narrow width corresponding to the width of each of the dividing grooves to be formed. Each of the dividing grooves of a narrow width is formed by irradiating the wafer with a laser beam narrowed in width by passing through the slit having the narrow width.

In order to use such a slit, as disclosed in Japanese Patent Laid-Open No. 2010-158710, a plate having the slit formed therein (mask plate) is adopted. In addition, as disclosed in Japanese Patent Laid-Open No. 2020-182960, the slit is formed by an interval between two plates.

SUMMARY OF THE INVENTION

However, the center line of the laser beam (optical axis of an optical system) may be displaced in the width direction of the slit due to secular degradation in a laser oscillator. That is, the center of the slit and the cross-sectional center of the laser beam may not coincide with each other. In this case, the dividing grooves may not have a predetermined depth due to insufficiency of the power of the laser beam which is necessary to form the dividing grooves, or the like.

It is accordingly an object of the present invention to provide a laser processing apparatus that can make the center of the slit and the cross-sectional center of the laser beam coincide with each other.

In accordance with an aspect of the present invention, there is provided a laser processing apparatus for forming a dividing groove in a wafer by irradiating an upper surface of the wafer held by a chuck table with a laser beam, the laser processing apparatus including a laser oscillator configured to emit the laser beam, a slit configured to narrow a width of the laser beam emitted from the laser oscillator to a width corresponding to the dividing groove to form the dividing groove of a predetermined width, a slit moving mechanism configured to move the slit in a direction corresponding to a width direction of the dividing groove, and an adjusting unit configured to make a center of the slit and a cross-sectional center of the laser beam entering the slit coincide with each other in a direction in which the slit moving mechanism moves the slit.

Preferably, the laser processing apparatus further includes a power meter configured to measure power of the laser beam passed through the slit, in which the adjusting unit includes a first control section configured to measure the power of the laser beam by the power meter while moving the slit in the direction corresponding to the width direction of the dividing groove by the slit moving mechanism, and stop moving the slit at a position at which the measured power is at a maximum.

In addition, preferably, the laser processing apparatus further includes a mirror configured to reflect the laser beam emitted from the laser oscillator and irradiate the wafer held on the chuck table with the laser beam, and a camera disposed on a back side of the mirror, and configured to image a transmitted laser beam as the laser beam emitted from the laser oscillator and passed through the mirror, in which the adjusting unit includes a center identifying section configured to identify a cross-sectional center of the transmitted laser beam on the basis of brightness of pixels of an image captured by the camera, and a second control section configured to control the slit moving mechanism on the basis of the cross-sectional center of the transmitted laser beam, the cross-sectional center being identified by the center identifying section, such that the cross-sectional center of the laser beam and the center of the slit coincide with each other in a moving direction of the slit.

In the laser processing apparatus according to one aspect of the present invention, the adjusting unit makes the cross-sectional center of the laser beam and the center of the slit coincide with each other. For example, the first control section of the adjusting unit adjusts the position of the slit such that an amount of power of the laser beam is maximized, or the second control section of the adjusting unit adjusts the position of the slit on the basis of the cross-sectional center of the transmitted laser beam. The cross-sectional center of the laser beam and the center of the slit are thereby made to coincide with each other. It is consequently possible to suppress insufficiency of the power of the laser beam, so that a dividing groove having a predetermined depth can be formed in the wafer.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
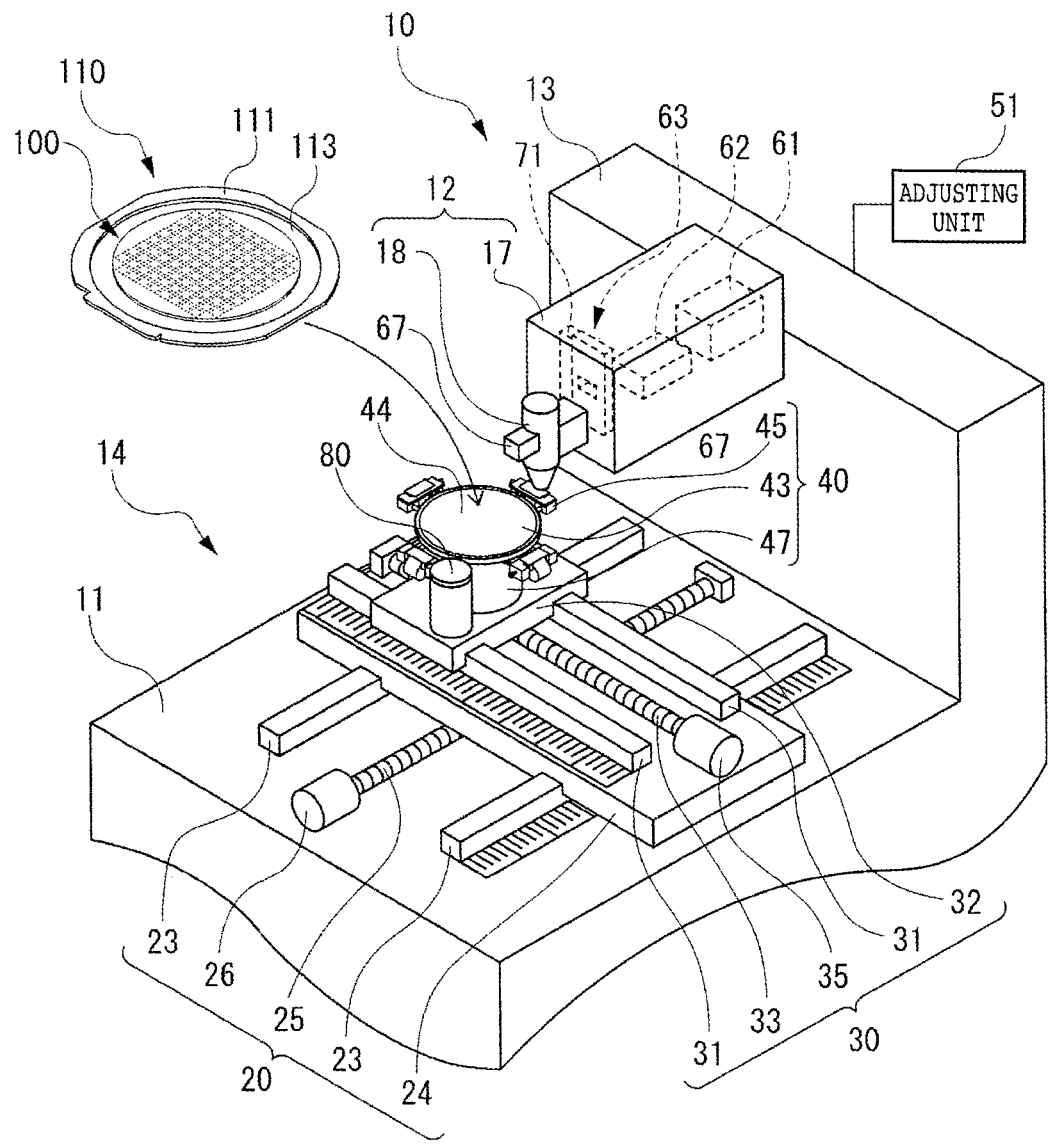
FIG. 1 is a perspective view illustrating a configuration of a laser processing apparatus.
Figure 1:
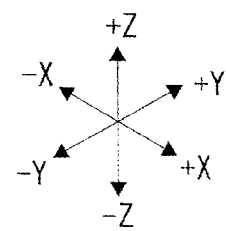

An embodiment of the present invention will hereinafter be described with reference to the accompanying drawings. A laser processing apparatus 10 illustrated in FIG. 1 is an apparatus for forming a dividing groove in a wafer 100 by irradiating the upper surface of the wafer 100 held by a chuck table 43 with a laser beam.

The laser processing apparatus 10 includes a rectangular parallelepipedic base 11, a standing wall portion 13 erected on one end of the base 11, and an adjusting unit 51 that controls various members of the laser processing apparatus 10. The adjusting unit 51 is, for example, constituted by a computer including a processing apparatus and a storage apparatus. The adjusting unit 51 controls operation of the various parts of the laser processing apparatus 10 and the like such that the wafer 100 is processed appropriately. The processing apparatus is typically a central processing unit (CPU). The processing apparatus performs various processing necessary to control the various parts. The storage apparatus, for example, includes a main storage apparatus such as a dynamic random access memory (DRAM) and an auxiliary storage apparatus such as a hard disk drive or a flash memory. Functions of the adjusting unit 51 are, for example, implemented by operation of the processing apparatus according to software such as a program stored in the storage apparatus.

A chuck table moving mechanism 14 that moves the chuck table 43 is provided on the upper surface of the base 11. The chuck table moving mechanism 14 processing-feeds the chuck table 43 in an X-axis direction, and index-feeds the chuck table 43 in a Y-axis direction orthogonal to the X-axis direction.

The chuck table moving mechanism 14 includes a chuck table unit 40 including the chuck table 43, a Y-axis moving mechanism 20 that moves the chuck table 43 in the Y-axis direction as an index feeding direction, and an X-axis moving mechanism 30 that moves the chuck table 43 in the X-axis direction as a processing feed direction. The chuck table 43 has a holding surface 44 for holding the wafer 100.

The Y-axis moving mechanism 20 moves the chuck table 43 in the Y-axis direction parallel with the holding surface 44 and orthogonal to the X-axis direction with respect to a laser processing mechanism 12.

The Y-axis moving mechanism 20 includes a pair of guide rails 23 extending in the Y-axis direction, a Y-axis table 24 mounted on the guide rails 23, a ball screw 25 extending in parallel with the guide rails 23, and a driving motor 26 that rotates the ball screw 25.

The pair of guide rails 23 is disposed on the upper surface of the base 11 so as to be parallel with the Y-axis direction. The Y-axis table 24 is installed on the pair of guide rails 23 so as to be slidable along these guide rails 23. The X-axis moving mechanism 30 and the chuck table unit 40 are mounted on the Y-axis table 24.

The ball screw 25 is screwed into a nut portion (not illustrated) provided to the Y-axis table 24. The driving motor 26 is coupled to one end portion of the ball screw 25. The driving motor 26 rotationally drives the ball screw 25. When the ball screw 25 is rotationally driven, the Y-axis table 24, the X-axis moving mechanism 30, and the chuck table unit 40 move in the Y-axis direction along the guide rails 23.

The X-axis moving mechanism 30 moves the chuck table 43 in the X-axis direction parallel with the holding surface 44 with respect to the laser processing mechanism 12.

The X-axis moving mechanism 30 includes a pair of guide rails 31 extending in the X-axis direction, an X-axis table 32 mounted on the guide rails 31, a ball screw 33 extending in parallel with the guide rails 31, and a driving motor 35 that rotates the ball screw 33.

The pair of guide rails 31 is disposed on the upper surface of the Y-axis table 24 so as to be parallel with the X-axis direction. The X-axis table 32 is installed on the pair of guide rails 31 so as to be slidable along these guide rails 31. The chuck table unit 40 and a power meter 80 are mounted on the X-axis table 32.

The ball screw 33 is screwed into a nut portion (not illustrated) provided to the X-axis table 32. The driving motor 35 is coupled to one end portion of the ball screw 33. The driving motor 35 rotationally drives the ball screw 33. When the ball screw 33 is rotationally driven, the X-axis table 32 and the chuck table unit 40 move in the processing feed direction (X-axis direction) along the guide rails 31.

The chuck table unit 40 is used to hold the wafer 100 as an example of a workpiece. As illustrated in FIG. 1, the wafer 100 is held by the chuck table unit 40 as a work set 110 including a ring frame 111, an adhesive tape 113, and the wafer 100.

The chuck table unit 40 includes the chuck table 43 that holds the wafer 100, clamp units 45 provided on the periphery of the chuck table 43, and a θ table 47 that supports the chuck table 43. The θ table 47 is provided on the upper surface of the X-axis table 32 so as to be rotatable within an XY plane.

The chuck table 43 is a member for holding the wafer 100. The chuck table 43 is formed in a disk shape, and is provided on the θ table 47.

The holding surface 44 formed of a porous material is formed as the upper surface of the chuck table 43. This holding surface 44 is made to communicate with a suction source (not illustrated), and can thereby suck and hold the wafer 100 in the work set 110.

Four clamp units 45 are provided on the periphery of the chuck table 43. The four clamp units 45 are driven by an air actuator (not illustrated), and thereby hold and fix, from four directions, the ring frame 111 on the periphery of the wafer 100 held on the chuck table 43.

The standing wall portion 13 of the laser processing apparatus 10 is erected in the rear of the chuck table moving mechanism 14. The laser processing mechanism 12 is provided on the front surface of the standing wall portion 13.

The laser processing mechanism 12 performs ablation processing on the wafer 100 held on the chuck table 43 by applying a laser beam. Specifically, the laser processing mechanism 12 forms a dividing groove in the wafer 100 along a planned dividing line by irradiating the upper surface of the wafer 100 with the laser beam.

The laser processing mechanism 12 includes a processing head 18 that irradiates the wafer 100 with the laser beam, and an arm section 17 that supports the processing head 18.

The arm section 17 projects in the direction of the chuck table moving mechanism 14 from the standing wall portion 13. The processing head 18 is supported by a distal end of the arm section 17 so as to face the chuck table 43 of the chuck table unit 40 or the power meter 80 in the chuck table moving mechanism 14.

An optical system of the laser processing mechanism 12 is provided in the arm section 17 and the processing head 18.

Figure 2:
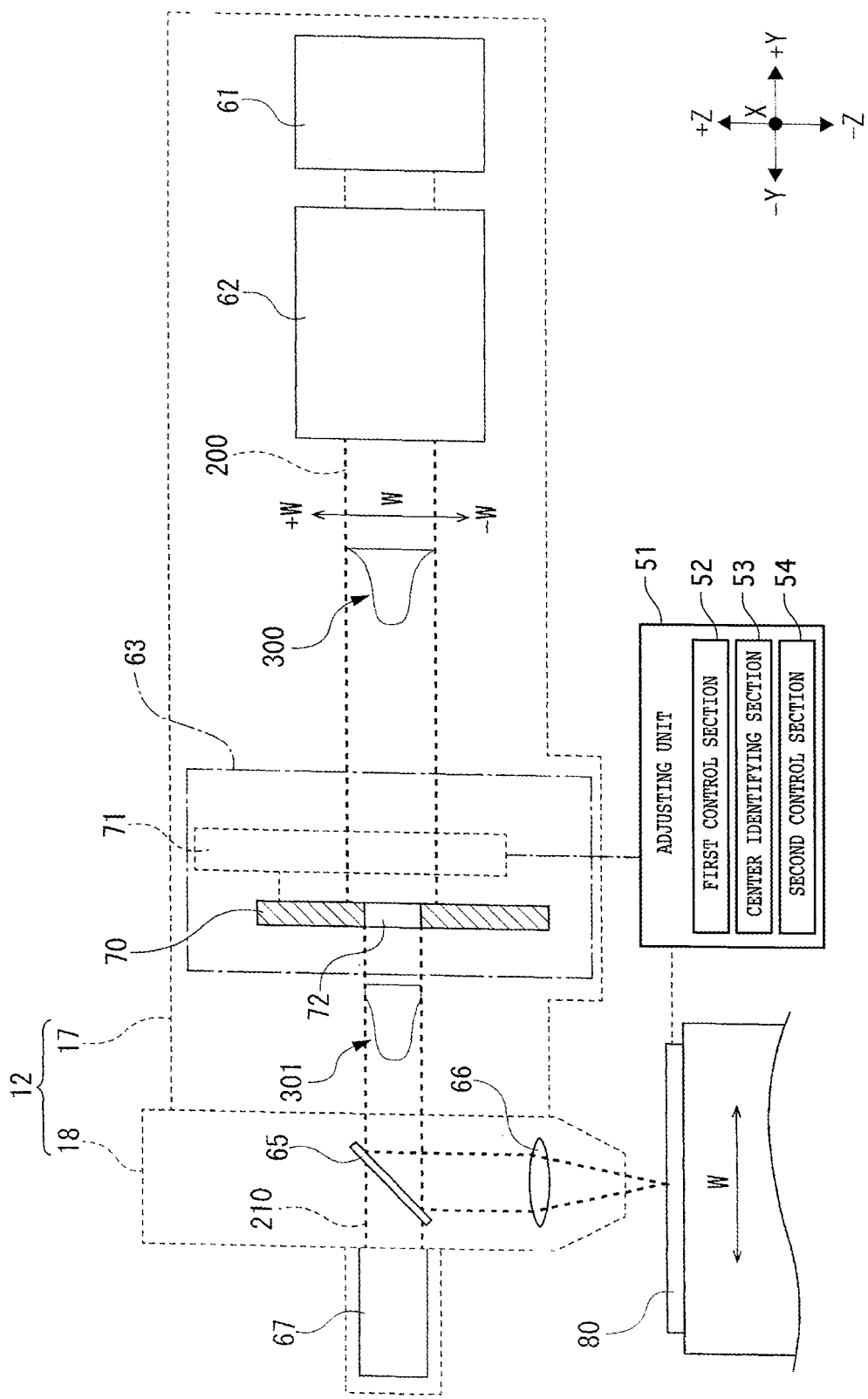
FIG. 2 is an explanatory diagram illustrating a configuration of a laser processing mechanism.

As illustrated in FIG. 1 and FIG. 2, the laser processing mechanism 12 includes, in the arm section 17, a laser oscillator 61 that generates and emits a laser beam 200, a beam expander 62 for adjusting the laser beam emitted from the laser oscillator 61 into collimated light, and an energy distribution corrector 63 that corrects an energy distribution of the laser beam 200.

In addition, as illustrated in FIG. 2, the laser processing mechanism 12 includes, in the processing head 18, a mirror 65 that reflects the laser beam 200, and a condenser (condensing lens) 66 that condenses and outputs the laser beam 200.

The mirror 65 is, for example, used to reflect the laser beam 200 emitted from the laser oscillator 61, and irradiate the wafer 100 held on the holding surface 44 (see FIG. 1) of the chuck table 43 with the laser beam 200. In addition, the mirror 65 is configured to transmit a part of the incident laser beam 200.

Further, the laser processing mechanism 12 includes a camera 67 on the side surface of the processing head 18 and on the back side of the mirror 65.

The laser oscillator 61 is, for example, a solid-state laser light source. The laser oscillator 61 emits the laser beam 200 in a −Y direction in the arm section 17. The energy distribution of the laser beam 200 can be approximated by a Gaussian distribution. Hence, the energy of the laser beam 200 has a distribution as indicated by an arrow 300 in a section in a W-axis direction.

Here, the W-axis direction is a direction orthogonal to a center line (optical axis of the optical system) along the traveling direction of the laser beam 200 and orthogonal to the X-axis direction as the processing feed direction (direction perpendicular to a paper plane of FIG. 2). Hence, the W-axis direction coincides with a Z-axis direction in the arm section 17 and coincides with the Y-axis direction in the processing head 18 (in a position on the −Z direction side of the mirror 65). Incidentally, this W-axis direction is a direction corresponding to the width direction of a dividing groove to be formed in the wafer 100.

The energy distribution corrector 63 is disposed between the laser oscillator 61 and the mirror 65. The energy distribution corrector 63 corrects the energy distribution in the W-axis direction of the laser beam 200 by blocking a part of the laser beam 200.

The laser beam 200 passed through the energy distribution corrector 63 is reflected in a −Z direction by the mirror 65 in the processing head 18, and is guided to the condenser 66. The condenser 66 condenses the laser beam 200, and applies the laser beam 200 in the −Z direction to the outside of the processing head 18.

At a time of processing the wafer 100 illustrated in FIG. 1, the laser beam 200 condensed by the condenser 66 is applied to the wafer 100 on the chuck table 43.

On the other hand, at a time of correction of the energy distribution of the laser beam 200, as illustrated in FIG. 2, the laser beam 200 is applied to the power meter 80.

A configuration of the energy distribution corrector 63 will be described here. As indicated by an arrow 301, the energy distribution corrector 63 corrects the energy distribution in the W-axis direction of the laser beam 200 to an energy distribution obtained by vertically cutting a foot part of the Gaussian distribution. The width (length in the W-axis direction) of the laser beam 200 is thereby set.

As illustrated in FIG. 2, the energy distribution corrector 63 includes a slit plate 70 having a slit 72 disposed on the center line of the laser beam 200, and a slit moving mechanism 71 that moves the slit plate 70 in the W-axis direction.

Figure 3:
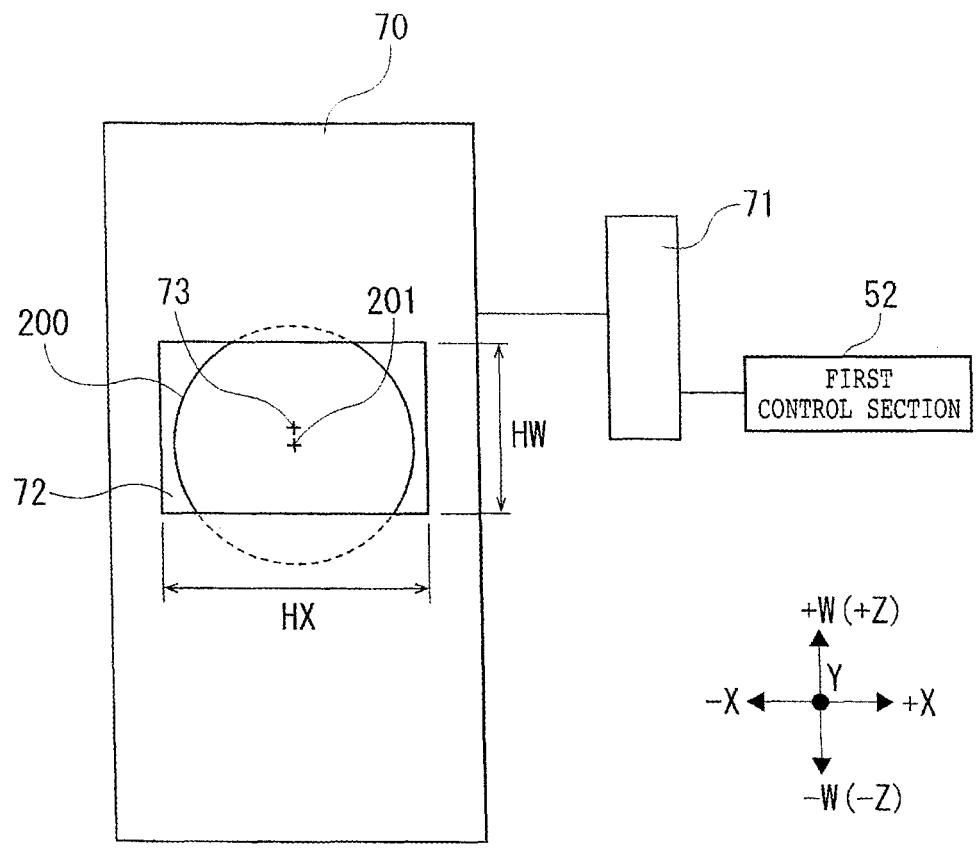
FIG. 3 is an explanatory diagram illustrating a state in which the center of a slit and the center of a laser beam are displaced from each other.

As illustrated in FIG. 2 and FIG. 3, the slit plate 70 is disposed in the arm section 17 so as to be parallel with a ZX plane, which is a plane perpendicular to the center line of the laser beam 200 in the arm section 17.

The slit 72 formed in the slit plate 70 is used to narrow the width of the laser beam 200 emitted from the laser oscillator 61 to a width corresponding to a dividing groove in order to form the dividing groove of a predetermined width in the wafer 100. As illustrated in FIG. 3, the slit 72 has a rectangular shape, and is defined by a first width HX in the X-axis direction and a second width HW in the W-axis direction which corresponds to the dividing groove.

The slit moving mechanism 71 moves the slit plate 70 having the slit 72 in the W-axis direction (Z-axis direction in the arm section 17) as a direction corresponding to the width direction of the dividing groove to be formed in the wafer 100. The slit moving mechanism 71 can thereby make a center 73 of the slit 72 coincide with a cross-sectional center 201 of the laser beam 200 passed through the slit 72 in the moving direction of the slit 72. This cross-sectional center 201 is a center of a section in the ZX plane of the laser beam 200 entering the slit 72, and corresponds to the peak of the Gaussian distribution of the laser beam 200 (the center line of the laser beam 200 and the optical axis of the optical system).

The power meter 80 illustrated in FIG. 1 and FIG. 2 is disposed downstream of the condenser 66 in the traveling direction of the laser beam 200. The power meter 80 is irradiated with the laser beam 200 condensed by the condenser 66. The power meter 80 thereby measures the power (energy amount) of the laser beam 200 passed through the slit 72.

The adjusting unit 51 performs ablation processing on the wafer 100 by controlling various members of the laser processing apparatus 10.

In addition, the adjusting unit 51 performs energy distribution correction on the laser beam 200 by controlling the slit moving mechanism 71 illustrated in FIG. 2 in order to adjust the shape of the dividing groove to be formed in the wafer 100 by the ablation processing.

That is, the adjusting unit 51 makes the center of the slit 72 and the cross-sectional center 201 of the laser beam 200 entering the slit 72 coincide with each other in the moving direction of the slit 72 by controlling the slit moving mechanism 71 and thereby moving the slit plate 70 having the slit 72 in the W-axis direction (Z-axis direction).

When the center of the slit 72 coincides with the cross-sectional center 201 of the laser beam 200, the energy distribution of the laser beam 200 passed through the slit 72 has only power necessary to form a dividing groove, with the foot part of the Gaussian distribution cut vertically. The shape of the dividing groove formed in the wafer 100 can be thereby made to be an appropriate shape having a predetermined depth.

In the following, description will be made of operation of the energy distribution correction on the laser beam 200 by the adjusting unit 51.

As illustrated in FIG. 2, the adjusting unit 51 includes a first control section 52. The first control section 52 measures the power of the laser beam 200 by the power meter 80 while moving the slit 72 in the W-axis direction by the slit moving mechanism 71. The first control section 52 stops moving the slit 72 when the measured power is at a maximum, that is, when the center 73 of the slit 72 and the cross-sectional center 201 of the laser beam 200 are determined to coincide with each other in the W-axis direction.

Specifically, the first control section 52 measures the power of the laser beam 200 by the power meter 80 while continuously and slightly moving the slit 72 of the slit plate 70 in each of a −W direction and a +W direction, for example, in the W-axis direction by controlling the slit moving mechanism 71. Then, when the power of the laser beam 200 measured by the power meter 80 is at a maximum, the first control section 52 stops the position in the W-axis direction of the slit 72. That is, the first control section 52 adjusts the position in the W-axis direction of the slit 72 so as to maximize the power of the laser beam 200.

For example, as illustrated in FIG. 3, the center 73 of the slit 72 and the cross-sectional center 201 of the laser beam 200 may be slightly displaced from each other in the W-axis direction (Z-axis direction).

Figure 4:
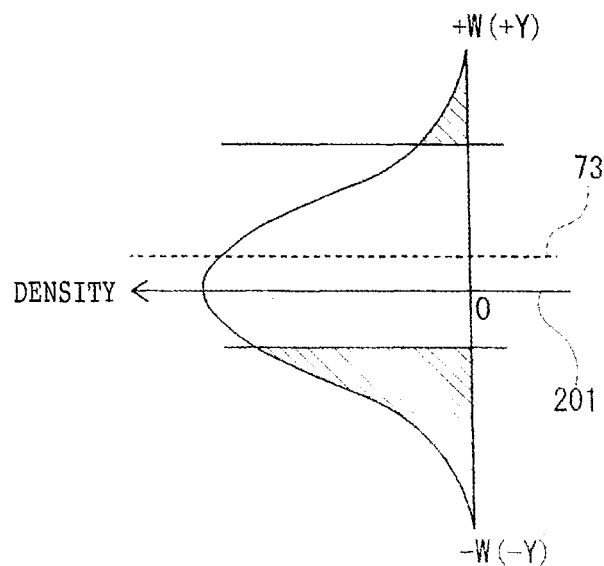
FIG. 4 is a graph illustrating the energy distribution of the laser beam in the state illustrated in FIG. 3.

In this case, end portions of the laser beam 200 are blocked asymmetrically (irregularly) by the slit 72. As a result, as illustrated in FIG. 4, the energy distribution (density) of the laser beam 200 becomes asymmetric in the W-axis direction. When a dividing groove is formed in the wafer 100 in this state, the dividing groove may not have a predetermined depth due to insufficiency of the power of the laser beam 200 which is necessary to form the dividing groove, or the like. Further, a processing defect (shape defect) may occur, such as the occurrence of a depth difference in the W-axis direction (Y-axis direction) in the dividing groove and resulting unevenness of the bottom surface of the groove.

In addition, in a case where a Low-k film is formed on planned dividing lines, and the Low-k film is severed by laser processing, a processing defect may occur in that the Low-k film is not severed or one side of the severed Low-k film is turned up.

Accordingly, in the present embodiment, the first control section 52 adjusts the position in the W-axis direction of the slit 72 such that the energy amount of the laser beam 200 is maximized, as described above. In an example illustrated in FIG. 3 and FIG. 5, this adjustment lowers the slit plate 70 having the slit 72 in the −W direction as indicated by an arrow 250 in FIG. 5.

Figure 6:
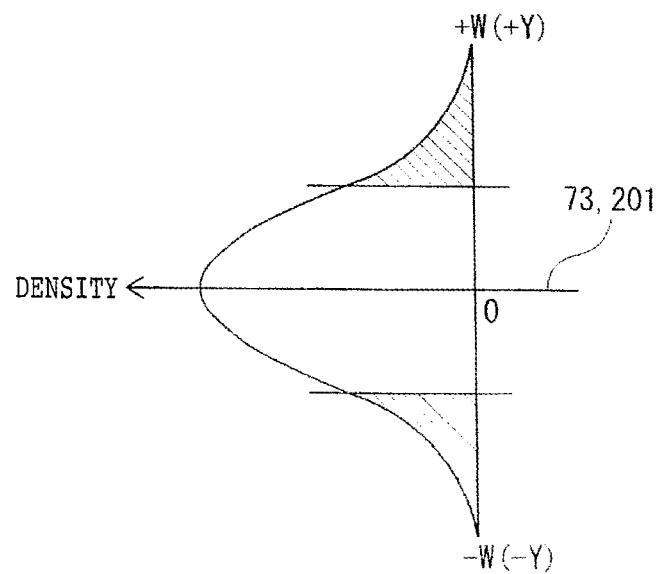
FIG. 6 is a graph illustrating the energy distribution of the laser beam in the state illustrated in FIG. 5.

Consequently, in the W-axis direction, the center 73 of the slit 72 and the cross-sectional center 201 of the laser beam 200 coincide with each other, and end portions of the laser beam 200 are symmetrically blocked by the slit 72. As a result, as illustrated in FIG. 6, the energy distribution (density) of the laser beam 200 becomes symmetric in the W-axis direction, so that insufficiency of the power of the laser beam 200 can be resolved. It is thereby possible to form a dividing groove having a predetermined depth and an appropriate shape in the wafer 100.

In addition, in the present embodiment, the W-axis direction as a direction in which the slit moving mechanism 71 moves the slit plate 70 is the Z-axis direction orthogonal to the X-axis direction. It is therefore possible to suppress a displacement between the center 73 of the slit and the cross-sectional center 201 of the laser beam 200 in the X-axis direction with the movement of the slit plate 70.

Incidentally, as illustrated in FIG. 2, a part of the laser beam 200 passed through the energy distribution corrector 63 passes through the mirror 65, and enters the camera 67 disposed on the back side of the mirror 65. The camera 67 images the incident laser beam 200. That is, the camera 67 images a transmitted laser beam 210 as a laser beam emitted from the laser oscillator 61 and passed through the mirror 65.

In the present embodiment, the adjusting unit 51 may correct the energy distribution of the laser beam 200 on the basis of an image imaged by the camera 67. In the following, description will be made of an operation of correcting the energy distribution in this case.

As illustrated in FIG. 2, the adjusting unit 51 includes a center identifying section 53 and a second control section 54. The center identifying section 53 identifies the cross-sectional center of the transmitted laser beam 210 on the basis of the brightness of pixels of the image captured by the camera 67.

The second control section 54 controls the slit moving mechanism 71 on the basis of the cross-sectional center of the transmitted laser beam 210 which is identified by the center identifying section 53 such that the cross-sectional center 201 of the laser beam 200 and the center 73 of the slit 72 coincide with each other in the W-axis direction as the moving direction of the slit 72.

Figure 7:
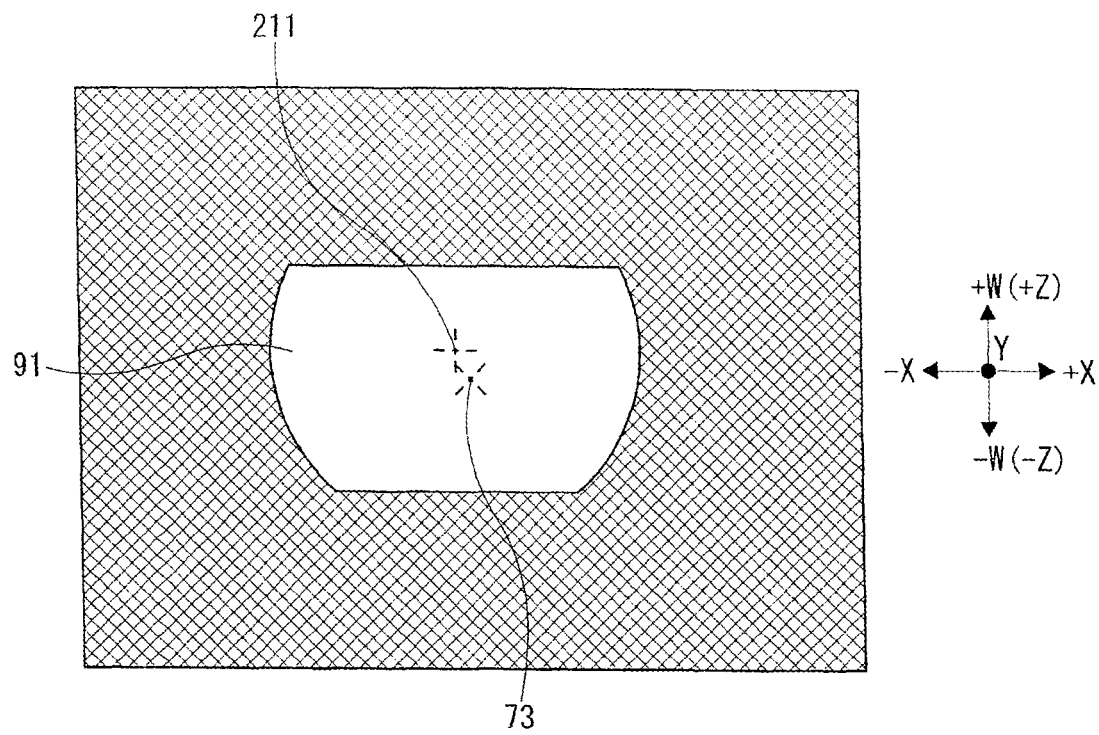
FIG. 7 is an explanatory diagram illustrating an example of an image captured by a camera.
Figure 8:
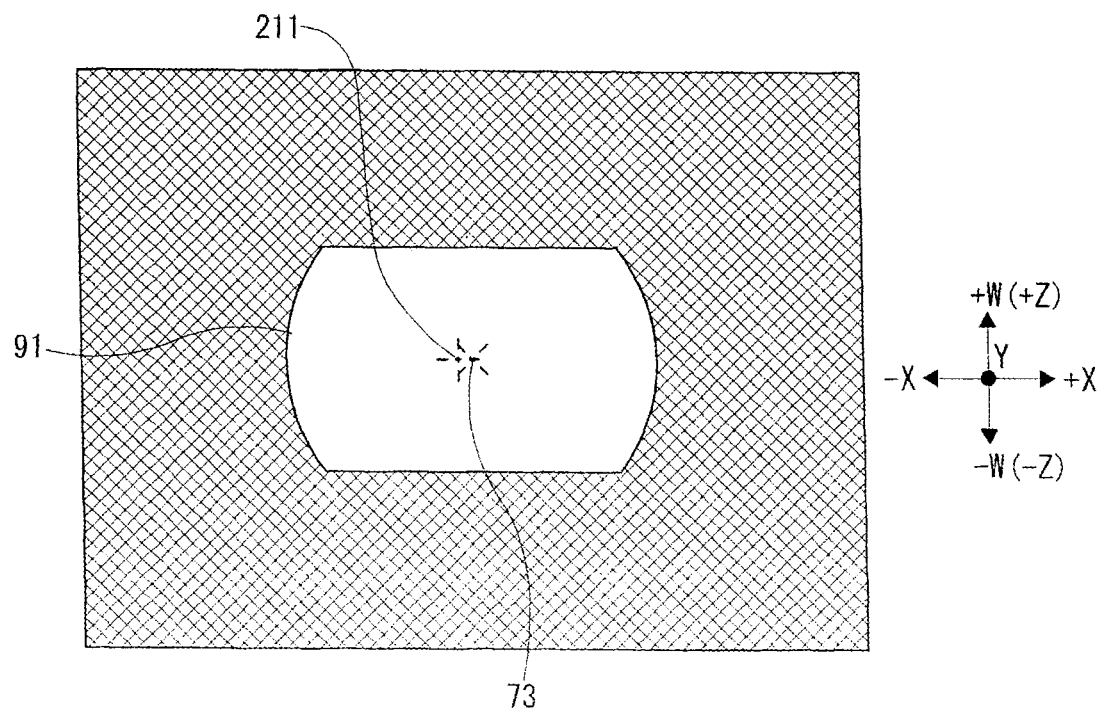
FIG. 8 is an explanatory diagram illustrating an example of the image captured by the camera.

FIG. 7 and FIG. 8 illustrate examples of the image captured by the camera 67. In addition, these figures illustrate the center 73 of the slit 72 and the cross-sectional center 211 of the transmitted laser beam 210.

In these figures, a bright region 91, which is a region of pixels brighter than a preset brightness in the captured image, corresponds to the transmitted laser beam 210. The center identifying section 53 identifies the cross-sectional center 211 of the transmitted laser beam 210 according to the shape of the bright region 91, for example. That is, the bright region 91 is an image of a part of a circle as a cross section of the transmitted laser beam 210. Accordingly, the center identifying section 53 determines the position of the center of the circle including the bright region 91 in the captured image, and identifies this position as the position of the cross-sectional center 211 of the transmitted laser beam 210.

In addition, the center identifying section 53 identifies the position of the center 73 of the slit 72 in the W-axis direction as the position of the center of a width in the W-axis direction in the bright region 91.

In the example illustrated in FIG. 7, the cross-sectional center 211 of the transmitted laser beam 210 and the center 73 of the slit 72 are slightly displaced from each other in the W-axis direction (Z-axis direction). In this case, as illustrated in FIG. 3, the cross-sectional center 201 of the laser beam 200 is also displaced from the center 73 of the slit 72 in the W-axis direction, and end portions of the laser beam 200 are asymmetrically blocked by the slit 72. As a result, as illustrated in FIG. 4, the energy distribution (density) of the laser beam 200 becomes asymmetric in the W-axis direction. Thus, as described above, the dividing groove may not have a predetermined depth, and a processing defect may occur.

Accordingly, the second control section 54 adjusts the position in the W-axis direction of the slit plate 70 including the slit 72 by controlling the slit moving mechanism 71 on the basis of the cross-sectional center 211 of the transmitted laser beam 210 such that the cross-sectional center 201 of the laser beam 200 and the center 73 of the slit 72 coincide with each other in the W-axis direction.

Specifically, the second control section 54 grasps a positional relation between the cross-sectional center 211 of the transmitted laser beam 210 and the center 73 of the slit 72 in the captured image, the cross-sectional center 211 and the center 73 being identified by the center identifying section 53, and the second control section 54 moves the slit 72 of the slit plate 70 in the W-axis direction by controlling the slit moving mechanism 71 such that the cross-sectional center 211 and the center 73 coincide with each other in the W-axis direction.

Figure 5:
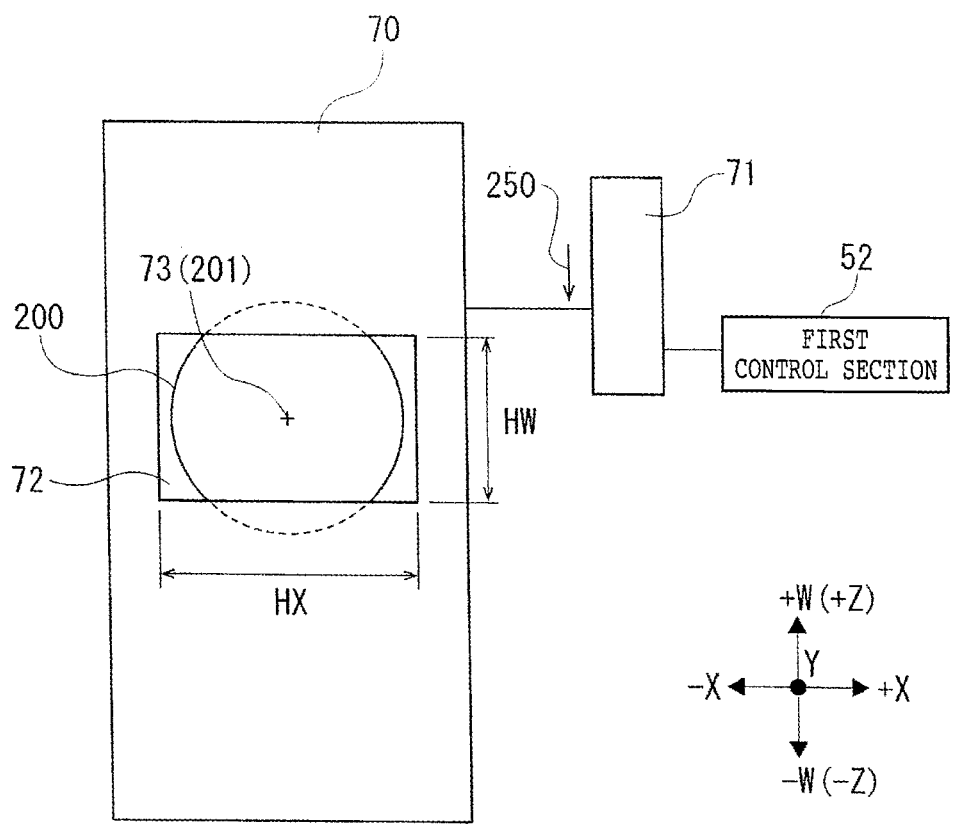
FIG. 5 is an explanatory diagram illustrating a state in which the center of the slit and the center of the laser beam coincide with each other.

As a result of this adjustment, as illustrated in FIG. 8, in the captured image, the center 73 of the slit 72 and the cross-sectional center 211 of the transmitted laser beam 210 coincide with each other in the W-axis direction. Thus, as illustrated in FIG. 5, the cross-sectional center 201 of the laser beam 200 also coincides with the center 73 of the slit 72 in the W-axis direction, and end portions of the laser beam 200 are symmetrically blocked by the slit 72. As a result, as illustrated in FIG. 6, the energy distribution of the laser beam 200 becomes symmetric in the W-axis direction, so that insufficiency of the power of the laser beam 200 can be resolved. It is thereby possible to form a dividing groove having a predetermined depth and an appropriate shape in the wafer 100.

Incidentally, the transmitted laser beam 210 is refracted when passing through the mirror 65 (a degree of refraction depends on the respective mirror). A deviation may therefore occur between the cross-sectional center 201 of the laser beam 200 and the cross-sectional center 211 of the transmitted laser beam 210. In a case where such a deviation occurs, the second control section 54 may store, in advance, the position of the cross-sectional center 211 of the transmitted laser beam 210 in the captured image when the cross-sectional center 201 of the laser beam 200 and the center 73 of the slit 72 coincide with each other. Then, when the second control section 54 adjusts the position of the slit 72, the second control section 54 may move the slit 72 such that the stored position of the cross-sectional center 211 of the transmitted laser beam 210 coincides with the center 73 of the slit 72 in the W-axis direction in the captured image.

In addition, the energy distribution correction on the laser beam 200 (alignment of the slit 72) by the first control section 52 by using the power meter 80 and the energy distribution correction on the laser beam 200 by the center identifying section 53 and the second control section 54 by using the captured image of the camera 67 as described above may be performed periodically. It thereby becomes easy to form a dividing groove having a predetermined depth and an appropriate shape in the wafer 100.

Figure 9:
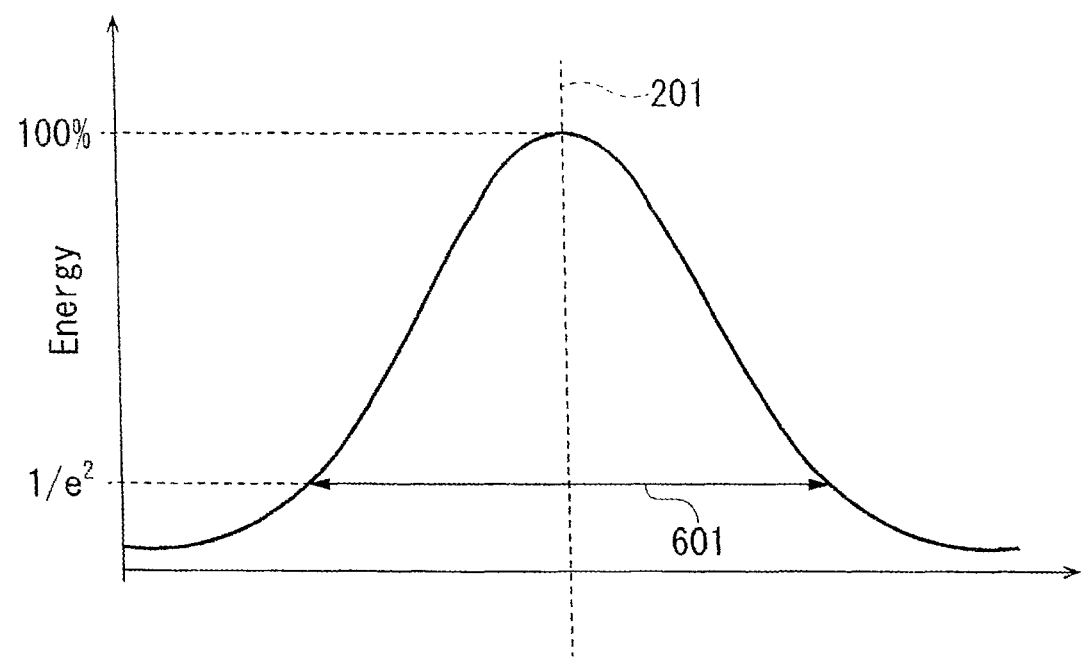
FIG. 9 is a graph illustrating the energy distribution of a symmetric laser beam.

In addition, as described above, the energy distribution of the laser beam 200 can be approximated by the Gaussian distribution, as illustrated in FIG. 9. In this case, the diameter of the beam can be defined as a beam diameter 601 at $1/e^2$ of a maximum value of energy in the energy distribution. In addition, in this case, the position of the cross-sectional center 201 of the laser beam 200 which is obtained in the present embodiment is a position corresponding to a peak of the Gaussian distribution in the laser beam 200.

Figure 10:
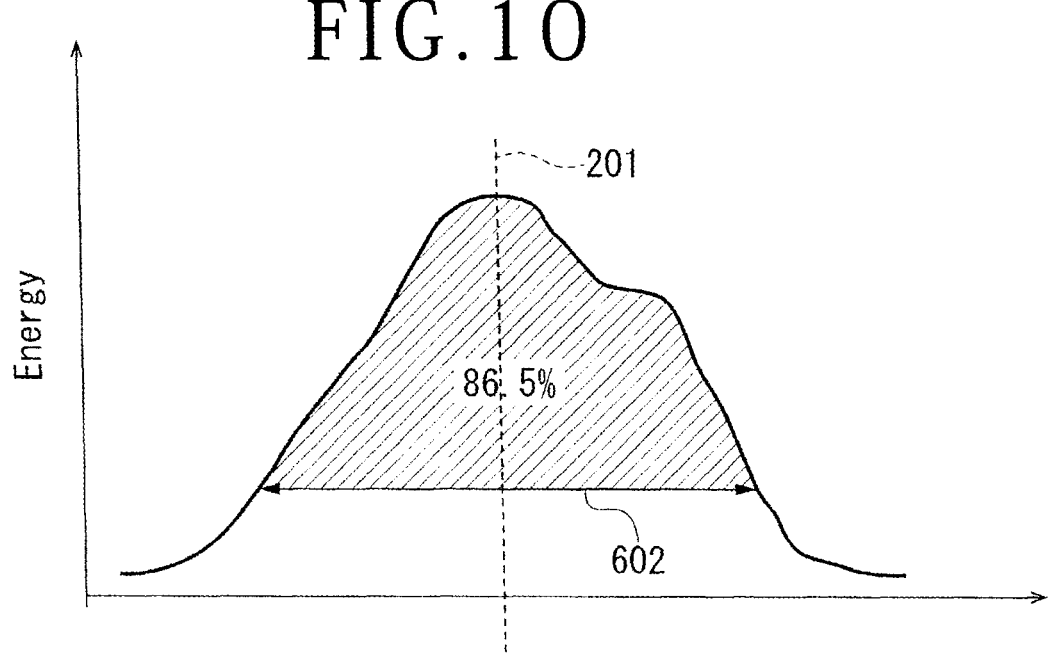
FIG. 10 is a graph illustrating the energy distribution of an asymmetric laser beam.

On the other hand, as illustrated in FIG. 10, the energy distribution of the laser beam 200 may be disturbed so as to have an asymmetric shape. In this case, the beam diameter may be defined as an aperture diameter 602. For the aperture diameter 602, a circle is calculated which includes a specific percentage (typically 86.5%) of energy with respect to a maximum energy value in a total energy of the laser beam 200. The aperture diameter 602 is obtained as the diameter of this circle. In addition, in this case, the position of the cross-sectional center 201 of the laser beam 200 which is obtained in the present embodiment is a position corresponding to the center of the aperture diameter 602.

In addition, in a case where the cross-sectional center 201 of the laser beam 200 is obtained by using the camera 67, the adjusting unit 51 can determine whether or not the shape of the laser beam 200 is an asymmetric shape as illustrated in FIG. 10 on the basis of the brightness of the pixels of the image captured by the camera 67. With regard to this, the adjusting unit 51 may be configured to determine whether or not the shape of the laser beam 200 is asymmetric and notify a result of the determination to a worker by using a notifying apparatus not illustrated.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A laser processing apparatus for forming a dividing groove in a wafer by irradiating an upper surface of the wafer held by a chuck table with a laser beam, the laser processing apparatus comprising:
   a laser oscillator configured to emit the laser beam;
   a slit configured to narrow a width of the laser beam emitted from the laser oscillator to a width corresponding to the dividing groove to form the dividing groove of a predetermined width;
   a slit moving mechanism configured to move the slit in a direction corresponding to a width direction of the dividing groove; and
   an adjusting unit comprising a central processing unit including a center identifying section that is configured to identify the cross-sectional center of the laser beam and a control section that is configured to control the slit moving mechanism;
   wherein the adjusting unit is configured to control the slit moving mechanism to make a center of the slit and the cross-sectional center of the laser beam entering the slit coincide with each other in a direction in which the slit moving mechanism moves the slit, and
   wherein the adjusting unit includes a center identifying section configured to identify a cross-sectional center of the transmitted laser beam on a basis of brightness of pixels of an image captured by a camera.

2. The laser processing apparatus according to claim 1, further comprising:
   a power meter configured to measure power of the laser beam passed through the slit, and
   wherein the adjusting unit includes:
      an additional control section configured to measure the power of the laser beam by the power meter while moving the slit in the direction corresponding to the width direction of the dividing groove by the slit moving mechanism, and stop moving the slit at a position at which the measured power is at a maximum.

3. A laser processing apparatus for forming a dividing groove in a wafer by irradiating an upper surface of the wafer held by a chuck table with a laser beam, the laser processing apparatus comprising:
   a laser oscillator configured to emit the laser beam;
   a slit configured to narrow a width of the laser beam emitted from the laser oscillator to a width corresponding to the dividing groove to form the dividing groove of a predetermined width;
   a slit moving mechanism configured to move the slit in a direction corresponding to a width direction of the dividing groove;
   an adjusting unit configured to make a center of the slit and a cross-sectional center of the laser beam entering the slit coincide with each other in a direction in which the slit moving mechanism moves the slit;
   a mirror configured to reflect the laser beam emitted from the laser oscillator and irradiate the wafer held on the chuck table with the laser beam; and
   a camera disposed on a back side of the mirror, and configured to image a transmitted laser beam as the laser beam emitted from the laser oscillator and passed through the mirror,
   wherein the adjusting unit includes:
      a center identifying section configured to identify a cross-sectional center of the transmitted laser beam on a basis of brightness of pixels of an image captured by the camera, and a second control section configured to control the slit moving mechanism on a basis of the cross-sectional center of the transmitted laser beam, the cross-sectional center being identified by the center identifying section, such that the cross-sectional center of the laser beam and the center of the slit coincide with each other in a moving direction of the slit.

* * * * *